(12) United States Patent
Hasegawa et al.

(10) Patent No.: US 7,298,117 B2
(45) Date of Patent: Nov. 20, 2007

(54) STEP-UP (BOOST) DC REGULATOR WITH TWO-LEVEL BACK-BIAS SWITCH GATE VOLTAGE

(75) Inventors: Morihito Hasegawa, Kasugai (JP); Hidekiyo Ozawa, Kasugai (JP); Shoji Tajiri, Kasugai (JP); Toshihiko Kasai, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 105 days.

(21) Appl. No.: 11/362,513

(22) Filed: Feb. 27, 2006

(65) Prior Publication Data
US 2007/0132435 A1    Jun. 14, 2007

(30) Foreign Application Priority Data
Dec. 8, 2005    (JP) .............................. 2005-355404

(51) Int. Cl.
G05F 1/10    (2006.01)
(52) U.S. Cl. ........................ 323/222; 323/284
(58) Field of Classification Search ................ 323/222, 323/282, 284
See application file for complete search history.

(56) References Cited

U.S. PATENT DOCUMENTS 5,422,591 A * 6/1995 Rastegar et al. ............ 327/409

7,161,333 B2 * 1/2007 Soch .......................... 323/224

FOREIGN PATENT DOCUMENTS

| JP | 1-295665 A | 11/1989 |
|---|---|---|
| JP | 3-74169 A | 3/1991 |
| JP | 8-186980 A | 7/1996 |
| JP | 2001-251849 A | 9/2001 |

* cited by examiner

*Primary Examiner*—Shawn Riley
(74) *Attorney, Agent, or Firm*—Arent Fox LLP.

(57) ABSTRACT

The invention provides a DC-DC converter capable of being started up in a state in which an input voltage is low and capable of being structured without increasing a circuit size. A back-gate voltage (Vsb) is outputted from a back-gate voltage generating circuit (VBGN), and is inputted to a back gate of a transistor (FET1). During a period during which an output voltage (Vout) is lower than a reference voltage (e0), an oscillation signal (OS1) is inputted to a gate of the transistor (FET1), and the back-gate voltage (Vsb) is set at a grounded voltage. Therefore, the transistor (FET1) has a reference threshold voltage (Vto). On the other hand, during a period during which the output voltage (Vout) is higher than the reference voltage (e0), a pulse signal (PS) is inputted to the gate of the transistor (FET1), and the back-gate voltage (Vsb) is set at an output voltage of a charge pump portion (5). Therefore, the transistor (FET1) has a threshold voltage higher than the reference threshold voltage (Vto).

11 Claims, 4 Drawing Sheets

CIRCUIT DIAGRAM OF DC-DC CONVERTER 1 ACCORDING TO PRESENT INVENTION

FIG.1 CIRCUIT DIAGRAM OF DC-DC CONVERTER 1 ACCORDING TO PRESENT INVENTION

FIG.2 CIRCUIT DIAGRAM OF BACK-GATE VOLTAGE GENERATING CIRCUIT VBGN

FIG.3 CIRCUIT DIAGRAM OF DC-DC CONVERTER 1a ACCORDING TO PRESENT INVENTION

FIG.4 (PRIOR ART)
CIRCUIT DIAGRAM OF DC-DC CONVERTER ACCORDING TO CONVENTIONAL INVENTION

STEP-UP (BOOST) DC REGULATOR WITH TWO-LEVEL BACK-BIAS SWITCH GATE VOLTAGE

CROSS-REFERENCE TO RELATED APPLICATIONS

This application is based upon and claims the benefit of priority from each of the prior Japanese Patent Application No. 2005-355404 filed on Dec. 8, 2005, the entire contents of which are incorporated herein by reference.

BACKGROUND OF THE INVENTION

1. Field of the Invention

This invention relates to a step-up type DC-DC converter and a method for controlling the step-up type DC-DC converter. More specifically, this invention relates to a DC-DC converter that is capable of being started up by a low input voltage and that has high efficiency.

2. Description of Related Art

A portable electronic device that uses batteries as a power source includes a DC-DC converter by which the voltage of the batteries is raised to a voltage necessary for the electronic device. Especially in a small-size portable electronic device, the number of batteries that can be mounted on the electronic device is small, and hence an extremely low voltage must be raised to a desired voltage of the electronic device. Additionally, since a battery-operated electronic device is required to be operated by a small number of batteries for a longer time, a DC-DC converter of the electronic device is required to have higher efficiency. In order to actuate the DC-DC converter from the state of a low input voltage and allow the DC-DC converter to work with high efficiency, Japanese unexamined patent publication No. H08(1996)-186980 proposes the following method.

Figure 4:
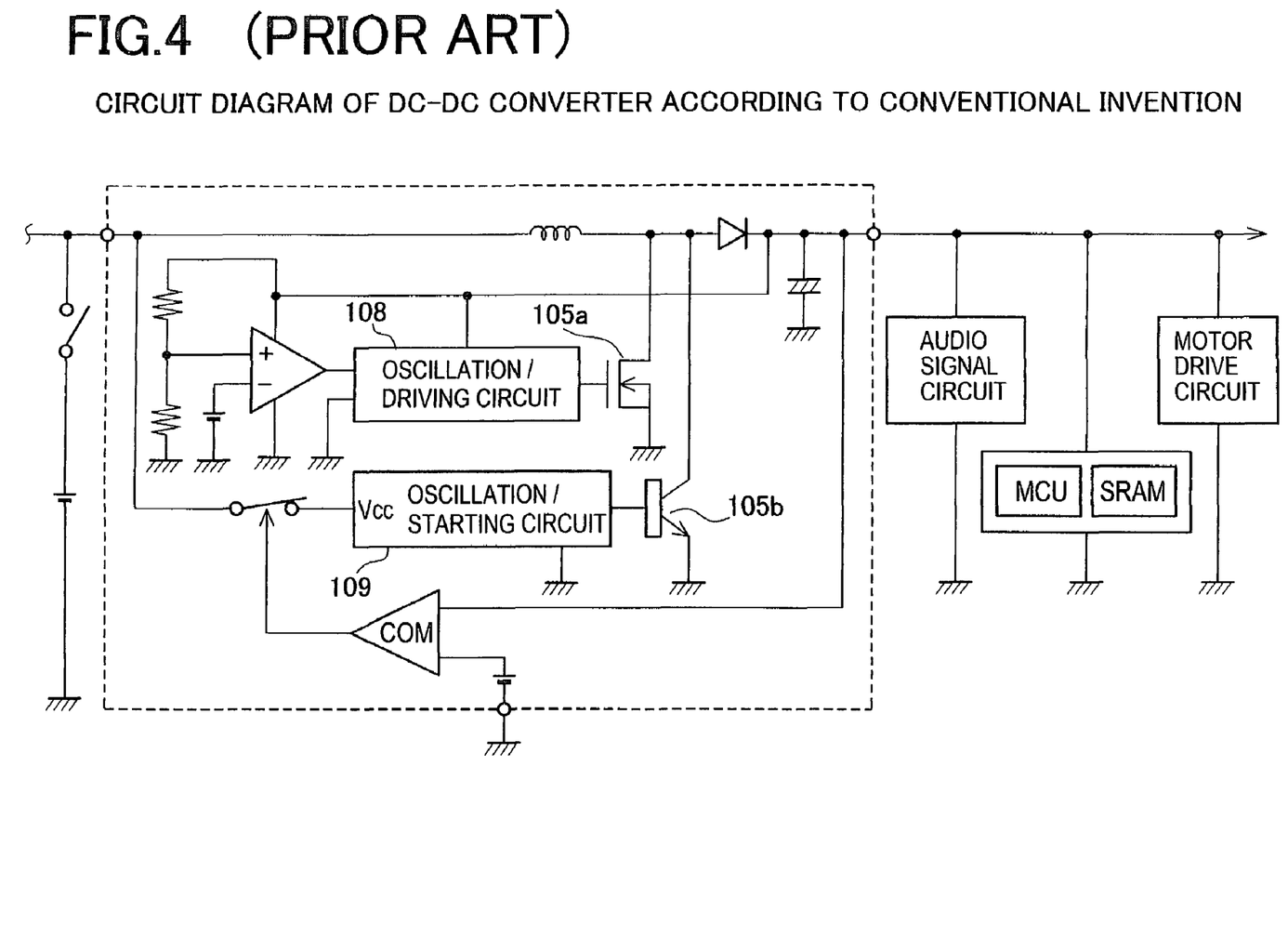
FIG. 4 is a circuit diagram of a DC-DC converter according to a conventional invention.

According to circuits disclosed by the publication '980 shown in FIG. 4, an oscillation/starting circuit 109 causes switching of a bipolar transistor 105b to generate a power of boosted voltage that is fed to a load when the voltage of a power source that is fed to the load is lower than a voltage value by which a MOS transistor can be turned on/off. When the boosted voltage reaches a proper voltage by which an oscillation/driving circuit 108 of a DC/DC converter of the MOS transistor is operated, the switching operation of the bipolar transistor 105b is stopped, and the MOS transistor 105a is actuated.

Japanese unexamined patent publication Nos. H03(1991)-74169, H01(1989)-295665, and 2001-251849 are disclosed as techniques related to the above publication '980.

SUMMARY OF THE INVENTION

According to the method disclosed by the publication '980 described above, at least one bipolar transistor 105b is needed as a main switching transistor in order to actuate the DC-DC converter in the state of a low input voltage. Additionally, in order to operate the DC-DC converter with high efficiency, another MOS transistor 105a, which is used as a main switching transistor, is needed. In other words, a plurality of main switching transistors are needed. Therefore, disadvantageously, the circuits are made complex, and are increased in size.

The present invention has been made to solve at least one of the problems of the conventional techniques. It is therefore an object of the present invention to provide a DC-DC converter capable of being started up in the state of a low input voltage and capable of being structured without increasing a circuit size, and provide a method for controlling the DC-DC converter.

To achieve the purpose above, there is provided a step-up type DC-DC converter comprising: a main switching transistor that is an N-type conductive element; a comparator that makes a comparison between a reference voltage and an output voltage and makes a discrimination between a first period during which the output voltage is lower than the reference voltage and a second period during which the output voltage is higher than the reference voltage; and a back-gate control unit that, in accordance with a comparison result obtained from the comparator, sets a back-gate voltage of the main switching transistor at a first back-gate voltage during the first period, and sets the back-gate voltage thereof at a second back-gate voltage lower than the first back-gate voltage during the second period.

The main switching transistor is an N-type conductive element in which a back-gate terminal and a source terminal are independent of each other. The comparator makes a comparison between the reference voltage and the output voltage of the DC-DC converter. Accordingly, the comparator makes a discrimination between a first period during which the output voltage is lower than the reference voltage and a second period during which the output voltage is higher than the reference voltage. For example, the first period is a period at the initial start of the DC-DC converter. For example, the second period is a period after the initial-start period elapses and then a steady state is reached. The back-gate control unit performs control operations in accordance with a comparison result obtained from the comparator. The back-gate voltage of the main switching transistor is defined as a first back-gate voltage during the first period, whereas the back-gate voltage thereof is defined as a second back-gate voltage during the second period. Herein, the second back-gate voltage is lower than the first back-gate voltage. For example, when the first back-gate voltage is a grounded voltage, the second back-gate voltage is set to be a negative voltage.

The DC-DC converter according to the present invention is a step-up type DC-DC converter that works while using its own output voltage as a supply voltage. When the DC-DC converter is started up, the output voltage of the DC-DC converter is lower than the reference voltage. At this time, the comparator shows a judgment result to the effect that this is the first period during which the output voltage is lower than the reference voltage. In accordance with the comparison result, the back-gate control unit sets the back-gate voltage of the main switching transistor at the first back-gate voltage value that is higher than the second back-gate voltage value. Therefore, the back-gate voltage value during the first period is made higher than that during the second period, and, accordingly, the threshold voltage of the main switching transistor during the first period is made lower than that during the second period. Herein, the amplitude of a control signal applied onto the gate of the main switching transistor during the first period is smaller than that during the second period. However, the main switching transistor can be operated to be turned on/off by lowering the threshold voltage during the first period.

In response to the operation of the main switching transistor, the output voltage of the DC-DC converter is gradually raised. Accordingly, the output voltage of the DC-DC converter becomes higher than the reference voltage, and the DC-DC converter shifts to a steady state. At this time, the comparator shows a comparison result to the effect that this is the second period during which the output voltage is higher than the second reference voltage. In accordance with the comparison result, the back-gate control unit changes the back-gate voltage of the main switching transistor from the first back-gate voltage value to the second back-gate voltage value. Since the second back-gate voltage is lower than the first back-gate voltage, the threshold voltage of the main switching transistor is raised.

As a result, the threshold voltage of the main switching transistor can be set to be low during the first period (for example, when the DC-DC converter is started up), and can be set to be high during the second period (for example, in the steady state). Therefore, the DC-DC converter can be started up even when the input voltage is low, and the main switching transistor can be brought into a completely electrically non-conductive state during the steady operation. Therefore, one main switching transistor can be used both as a transistor for initial start and as a transistor for steady operation. Hence, high efficiency can be achieved by preventing a leakage current, and the circuit size can be reduced.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Figure 1:
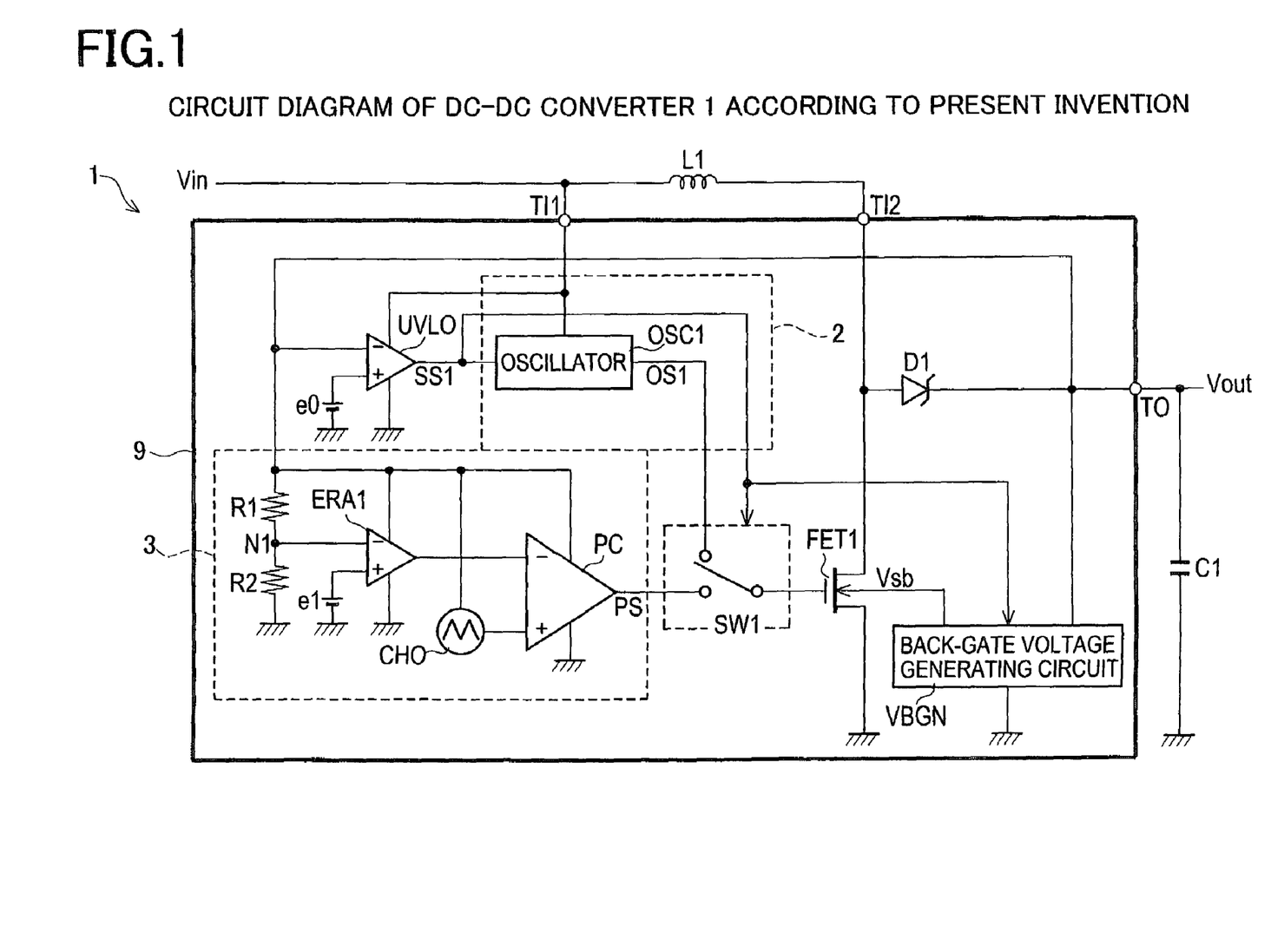
FIG. 1 is a circuit diagram of a DC-DC converter 1 according to the present invention.

Embodiments of the present invention will be described with reference to FIG. 1 and FIG. 2. FIG. 1 shows a DC-DC converter 1 according to the present invention. The DC-DC converter 1 is a converter into which a low voltage of, for example, 0.9(V) is inputted as an input voltage Vin and from which an output voltage Vout of, for example, 1.5 to 3.0(V) raised from 0.9(V) is outputted. Additionally, the DC-DC converter 1 is a converter in which the output voltage Vout raised therefrom is used as its own electric supply source. The DC-DC converter 1 includes a control unit 9, a choke coil L1, and a smoothing capacitor C1.

The control unit 9 includes a start-up control circuit 2, a PWM control circuit 3, a comparator UVLO, a switch SW1, a transistor FET1 that is a main switching element, a diode D1, and a back-gate voltage generating circuit VBGN. In FIG. 1, an input voltage Vin is inputted to an input terminal of the choke coil L1. An output terminal of the choke coil L1 is connected to a drain terminal of the transistor FET1, which is a switching element, through a terminal TI2. A source terminal of the transistor FET1 is connected to the ground. An output terminal of the switch SW1 is connected to a gate terminal of the transistor FET1. A back-gate terminal of the transistor FET1 is connected to the back-gate voltage generating circuit VBGN without being connected to the source terminal of the transistor FET1. The transistor FET1 is an NMOS transistor in which a threshold voltage Vth is pre-lowered by an ion concentration control operation or various film-thickness control operations in a production process. An input terminal of the diode D1 is connected to the terminal TI2 and the drain terminal of the transistor FET1. An output terminal of the diode D1 is connected to a terminal TO, the comparator UVLO, the PWM control circuit 3, and the back-gate voltage generating circuit VBGN. The smoothing capacitor C1 is connected between the terminal TO and the ground.

The PWM control circuit 3 includes resistance elements R1 and R2, an error amplifier ERA1, a triangular-wave oscillator CHO, and a PWM comparator PC. The resistance elements R1 and R2 are connected in series between the terminal TO and the ground through the node N1. The output voltage Vout is divided by the resistance elements R1 and R2. The node N1 is connected to an inverting input terminal of the error amplifier ERA1, whereas a reference voltage e1 is connected to a non-inverting input terminal thereof. Herein, the reference voltage e1 is a target voltage value of a divided voltage value of the output voltage Vout in the node N1, and is a predetermined value. An output terminal of the error amplifier ERA1 is connected to an inverting input terminal of the PWM comparator PC, whereas an output terminal of the triangular-wave oscillator CHO is connected to a non-inverting input terminal thereof. An output terminal of the PWM comparator PC is connected to the switch SW1. The output voltage Vout serving as a power source is supplied to the error amplifier ERA1, the triangular-wave oscillator CHO, and the PWM comparator PC.

The output voltage Vout is inputted to an inverting input terminal of the comparator UVLO, whereas a reference voltage e0 is inputted to a non-inverting input terminal thereof. A control signal SS1 is outputted from the comparator UVLO, and is inputted to an oscillator OSC1, the switch SW1, and the back-gate voltage generating circuit VBGN. The reference voltage e0 is a minimum voltage by which the transistor FET1 and the PWM control circuit 3 can be actuated. Herein, first, the reference voltage e0 is required to be a minimum gate voltage necessary to obtain the driving ability of the transistor FET1 so as to satisfy the specifications of the DC-DC converter 1. The minimum gate voltage is determined in accordance with a back-gate bias effect of the transistor FET1 that is fixed by a back-gate voltage Vsb, as described later. Second, the reference voltage e0 is required to be a minimum supply voltage by which the PWM control circuit 3 can be driven. Therefore, the reference voltage e0 is required to select and have a higher voltage value from between the minimum gate voltage and the minimum supply voltage.

The start-up control circuit 2 includes an oscillator OSC1. A control signal SS1 is inputted to the oscillator OSC1. An oscillation signal OS1 is outputted from the oscillator OSC1, and is inputted to the switch SW1. The input voltage Vin serving as a power source is supplied to the comparator UVLO and the oscillator OSC1 through the terminal TI1. The comparator UVLO, the oscillator OSC1, and the switch SW1 are circuits formed to be operable by a low-voltage power source such as the input voltage Vin.

Figure 2:
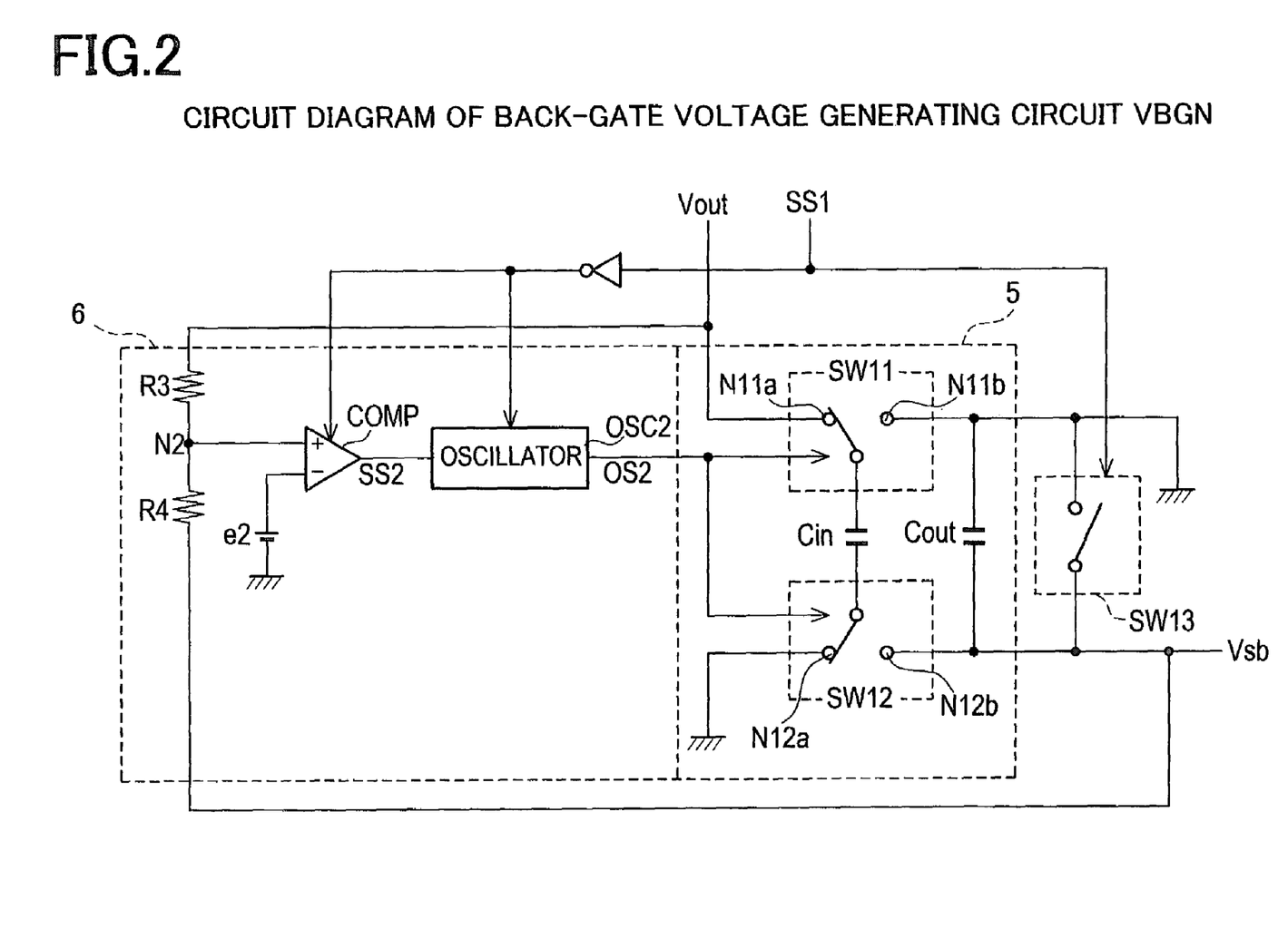
FIG. 2 is a circuit diagram of a back-gate voltage generating circuit VBGN.

FIG. 2 is a circuit diagram of the back-gate voltage generating circuit VBGN. The back-gate voltage generating circuit VBGN includes a charge pump portion 5, a switch control portion 6, and a switch SW13. The charge pump portion 5 includes an input capacitor Cin, an output capacitor Cout, and switches SW11 and SW12. The input capacitor Cin is used to store an electric charge by the output voltage Vout of the DC-DC converter 1. The output capacitor Cout is used to output a negative back-gate voltage Vsb. The switches SW11 and SW12 are switching-circuits used to control an operation to charge the input capacitor Cin with electricity and an operation to transfer the electric charge of the input capacitor Cin to the output capacitor Cout. Both ends of the input capacitor Cin are respectively connected to the switches SW11 and SW12. The output voltage Vout is inputted to a node N11a of the switch SW11. The node N11b is connected to one end of the output capacitor Cout and a grounded voltage. The grounded voltage is inputted to a node N12a of the switch SW12. The node N12b is connected to the other end of the output capacitor Cout, a resistance element R4, and the back-gate terminal of the transistor FET1 (see FIG. 1).

The switch control portion 6 includes a resistance element R3, the resistance element R4, a comparator COMP, and an oscillator OSC2. The resistance elements R3 and R4 are connected in series between the output voltage Vout and the back-gate voltage Vsb through the node N2. The node N2 is connected to a non-inverting input terminal of the comparator COMP, whereas a reference voltage e2 is connected to an inverting input terminal thereof. The voltage of the node N2 is obtained by dividing a voltage between the output voltage Vout and the back-gate voltage Vsb by the resistance elements R3 and R4. Herein, the reference voltage e2 is a target voltage value of the back-gate voltage Vsb during the steady operation of the DC-DC converter 1, and is a predetermined value. The threshold voltage Vth of the transistor FET1 is determined by the back-gate voltage Vsb, as described later, and the leakage current and the driving ability of the transistor FET1 are determined by the threshold voltage Vth. Therefore, it is necessary to determine the value of the reference voltage e2 so that the leakage current and the driving ability of the transistor FET1 satisfy the specifications of the DC-DC converter 1.

A control signal SS2 outputted from the comparator COMP is inputted to the oscillator OSC2. An oscillation signal OS2 outputted from the oscillator OSC2 is inputted to the switches SW11 and SW12. A negative phase signal of the control signal SS1 is inputted to the comparator COMP and an enabling terminal of the oscillator OSC2. The switch SW13 is connected in parallel with the output capacitor Cout. The control signal SS1 is inputted to the switch SW13. The back-gate voltage Vsb is outputted from the back-gate voltage generating circuit VBGN.

First, a description will be given of the operation of the DC-DC converter 1 performed when the DC-DC converter 1 is started up. In response to actuation of the DC-DC converter 1, an input voltage Vin is first applied. The value of the input voltage Vin is set at 0.9(V) or so when a battery is used, for example. An output voltage Vout lowered from the input voltage Vin by the forward-direction voltage drop amount of the diode D1 is outputted from the diode D1. The output voltage Vout is inputted to the comparator UVLO and the error amplifier ERA1. Since the output voltage Vout is lower than the reference voltage e0 when started up, a high-level control signal SS1 is outputted from the comparator UVLO.

The oscillator OSC1 is operable even when a supply voltage is in a low-voltage state, and hence the oscillator OSC1 can be actuated even by an input voltage Vin of 0.9(V). Therefore, in response to the input of the high-level control signal SS1, the oscillator OSC1 starts oscillations in predetermined cycles, and outputs an oscillation signal OS1. In response to the input of the high-level control signal SS1, the switch SW1 selects the oscillation signal OS1, and inputs this to the gate of the transistor FET1.

A description will be given of the operation of the back-gate voltage generating circuit VBGN with reference to FIG. 2. An inverted signal of the high-level control signal SS1 is inputted to the comparator COMP and the enabling terminal of the oscillator OSC2, and, in response to the input of the signal, these circuits reach an operation-stopped state. Therefore, the switch control portion 6 and the charge pump portion 5 are in the operation-stopped state. The switch SW13 reaches an electrically conductive state in response to the input of the high-level control signal SS1 to the switch SW13. Therefore, the back-gate voltage Vsb is set to be a grounded voltage by the switch SW13 during a period during which the output voltage Vout of the DC-DC converter 1 is lower than the reference voltage e0. In order to prevent the transistor FET1 from being damaged by the occurrence of a through-current, the back-gate voltage Vsb is required to be controlled so as not to become higher than the source voltage. In this embodiment, both the source voltage and the back-gate voltage Vsb are set to be the grounded voltage when the DC-DC converter 1 is started up, and hence there is no risk that the back-gate voltage Vsb will become higher than the source voltage.

An oscillation signal OS1 having a small amplitude corresponding to the input voltage Vin is inputted to the gate terminal of the transistor FET1, and a grounded voltage is inputted to the back-gate terminal. Let the value of the threshold voltage Vth of the transistor FET1 in a case in which the back-gate voltage Vsb at this time is set as the grounded voltage be a reference threshold voltage Vto. Herein, since the transistor FET1 is a transistor produced so that the standard threshold voltage Vto becomes low beforehand, current conducting/non-conducting operations are performed in accordance with the oscillation signal OS1 having a small amplitude. Accordingly, the output voltage Vout of the DC-DC converter 1 is gradually raised by the operation of the transistor FET1.

Next, a description will be given of the operation of the DC-DC converter 1 that is in a steady state. When the output voltage Vout of the DC-DC converter 1 is raised so as to become higher than the reference voltage e0, the DC-DC converter 1 changes from the start-up state to the steady state. The control signal SS1 of the comparator UVLO makes a transit from the high level to the low level. In response to the input of a low-level control signal SS1, the oscillator OSC1 stops the oscillations. In response to the input of the low-level control signal SS1, the switch SW1 performs a switchover so as to connect the output terminal of the PWM comparator PC included in the PWM control circuit 3 to the gate terminal of the transistor FET1.

When shifted to the steady state, the PWM control circuit 3 starts its operation. The error amplifier ERA1 makes a comparison between the reference voltage e1 and the voltage obtained by dividing the output voltage Vout by the resistance elements R1 and R2, and outputs a voltage corresponding to a difference therebetween to the PWM comparator PC. The PWM comparator PC is an output voltage pulse width converter, and outputs a pulse when the output voltage of the error amplifier ERA1 is higher than the output voltage of the triangular-wave oscillator CHO. Therefore, the PWM comparator PC outputs a pulse signal PS having a pulse width corresponding to the magnitude of the output voltage of the error amplifier ERA1. The pulse signal PS is inputted to the gate of the transistor FET1 through the switch SW1.

Referring now to FIG. 2, a description will be given of the operation of the back-gate voltage generating circuit VBGN being in a steady state. An inverted signal of a low-level control signal SS1 is inputted to the comparator COMP and the enabling terminal of the oscillator OSC2, and, in response thereto, these circuits reach an operation start-upstate. Accordingly, the switch control portion 6 and the charge pump portion 5 start their operations. Further, the low-level control signal SS1 is inputted to the switch SW13, and, in response thereto, the switch SW13 reaches an electrically non-conductive state. Therefore, the back-gate voltage Vsb serves as the output voltage of the charge pump portion 5 during a period during which the output voltage Vout of the DC-DC converter 1 is higher than the reference voltage e0.

When the voltage value of the node N2 becomes higher than the reference voltage e2, the comparator COMP of the switch control portion 6 outputs a high-level control signal SS2 to the oscillator OSC2. In response to the input of the high-level control signal SS2, the oscillator OSC2 starts oscillations in predetermined cycles, and outputs an oscillation signal OS2. During a period during which the oscillation signal OS2 maintains the high level, the switch SW11 is connected to the node N11a so as to supply the output voltage Vout, whereas the switch SW12 is connected to the node N12a so as to supply the ground voltage. Accordingly, the input capacitor Cin is charged with the output voltage Vout, so that an electric charge is stored. On the other hand, during a period during which the oscillation signal OS2 maintains the low level, the switch SW11 is connected to the node N11b, whereas the switch SW12 is connected to the node N12b, so that the connection between the input capacitor Cin and the output capacitor Cout becomes parallel. Therefore, the electric charge of the input capacitor Cin is transferred to the output capacitor Cout. Since the switch SW11 disposed on the side of the positive electrode of the input capacitor Cin is connected to the ground at this time, the output capacitor Cout is charged with a negative voltage.

The negative voltage of the output capacitor Cout gradually rises, and the voltage value of the node N2 decreases by repeating this operation in response to the oscillation signal OS2. When the voltage value of the node N2 becomes lower than the reference voltage e2, the level of the control signal SS2 becomes low, so that the oscillation signal OS2 cannot be outputted. As a result, the charge pump portion 5 is stopped, and the voltage of the node N2 is controlled to be equal to the reference voltage e2, thus making it possible to regulate the back-gate voltage Vsb so as to be equal to a predetermined negative voltage.

A description will be given of an effect, which is produced by controlling the back-gate voltage Vsb, in the transistor FET1. In order to actuate the transistor FET1 in a state of having a low input voltage, for example, when the DC-DC converter 1 is started up, the transistor FET1 is produced so that the threshold voltage Vth becomes low. Therefore, since the operation of the transistor FET1 in an electrically non-conductive state is imperfect, a leakage current is generated when a high voltage is applied to the drain. On the other hand, in a steady state, a pulse signal PS having a great amplitude is inputted into the gate of the transistor FET1, and hence the transistor FET1 can be actuated without lowering the threshold voltage Vth. Therefore, in order to reduce the leakage current, it is necessary to perform control so that the threshold voltage Vth becomes low at the start-up and becomes high during the steady operation.

The value of the threshold voltage Vth of the transistor FET1 at this time is expressed by the following equation (1):

$$Vth = Vto - \gamma((2\Phi f + Vsb)^{1/2} - (2\Phi f)^{1/2})$$ Equation (1)

In this equation, the reference threshold voltage Vto is a threshold value of the transistor FET1 obtained when the back-gate voltage is the ground voltage. Parameters $\gamma$ and $\Phi f$ are constants fixed by a process.

Therefore, at the start-up, the threshold value can be made equal to the reference threshold voltage Vto by setting the back-gate voltage Vsb at the ground voltage. It is understood from Equation (1) that, during the steady operation, the threshold voltage Vth can be made higher than the reference threshold voltage Vto by setting the back-gate voltage Vsb to be a negative voltage outputted from the charge pump portion 5. In the DC-DC converter 1 according to this embodiment, the back-gate voltage Vsb is regulated to be a predetermined negative voltage by the back-gate voltage generating circuit VBGN during the steady operation, and hence the threshold voltage Vth can be made higher than the reference threshold voltage Vto.

Thus, a rise in the threshold voltage Vth of the transistor FET1 makes it possible to bring the transistor FET1 serving as a power device into a completely electrically non-conductive state, and makes it possible to prevent the occurrence of a leakage current. Therefore, the DC-DC converter 1 can have high efficiency. Since the threshold voltage Vth of the transistor FET1 is made low at the start-up, a leakage current is generated. However, no problem arises, because the start-up state lasts only a short time, so that an influence exerted on power consumption is negligible. Additionally, since the switch SW1 is structured to be operable even by a low voltage power source, a leakage current is generated during the steady operation. However, no problem arises, because this leakage current is satisfactorily smaller than the leakage current of the transistor FET1 serving as a power device.

As described in detail above, the DC-DC converter 1 according to this embodiment supplies a raised output voltage Vout generated by the DC-DC converter 1 so as to be used as a power source for the DC-DC converter, and includes the oscillator OSC1 that operates by a low voltage for initial start-up and the transistor FET1 that has a low threshold voltage Vth. The DC-DC converter 1 further includes the back-gate voltage generating circuit VBGN that controls the back-gate voltage of the transistor FET1, whereby variable control can be performed so that the threshold voltage Vth of the DC-DC converter 1 becomes low at the start-up, and becomes high during the steady operation. As a result, the transistor FET1 can be actuated in the low-voltage state at the start-up, and the transistor FET1 can be prevented from generating a leakage current in the high-voltage state during the steady operation. Therefore, the transistor FET1 can also be used as a transistor for initial start-up and as a transistor for a steady operation, and hence high efficiency can be achieved by preventing the leakage current, and the circuit size can be reduced.

Obviously, the present invention is not limited to the above embodiment, and can be variously improved or modified within the scope not departing from the gist of the present invention. In the above embodiment, the switch SW1 is allowed to select and change a circuit that drives the gate of the transistor FET1 from between the start-up control circuit 2 and the PWM control circuit 3 as shown in FIG. 1. However, the present invention is not limited to this form. If the gate of the transistor FET1 has a multi-gate structure in which a plurality of gates are laid out with respect to a pair of source/drain, a part of the multi-gate of the transistor FET1 can be connected to the oscillator OSC1, and the remaining gates can be connected to the PWM comparator PC as in a DC-DC converter 1a of FIG. 3. At this time, the number of gates connected to the oscillator OSC1 is made smaller than that of gates connected to the PWM comparator PC. In the DC-DC converter 1a, a control signal SS1 is inputted to an enabling terminal (not shown) of the oscillator OSC1. Further, an inverted signal of the control signal SS1 is inputted to an enabling terminal (not shown) of the error amplifier ERA1, the triangular-wave oscillator CHO, and the PWM comparator PC. The other structures are the same as in the DC-DC converter 1, and a detailed description of these structures is omitted here.

Figure 3:
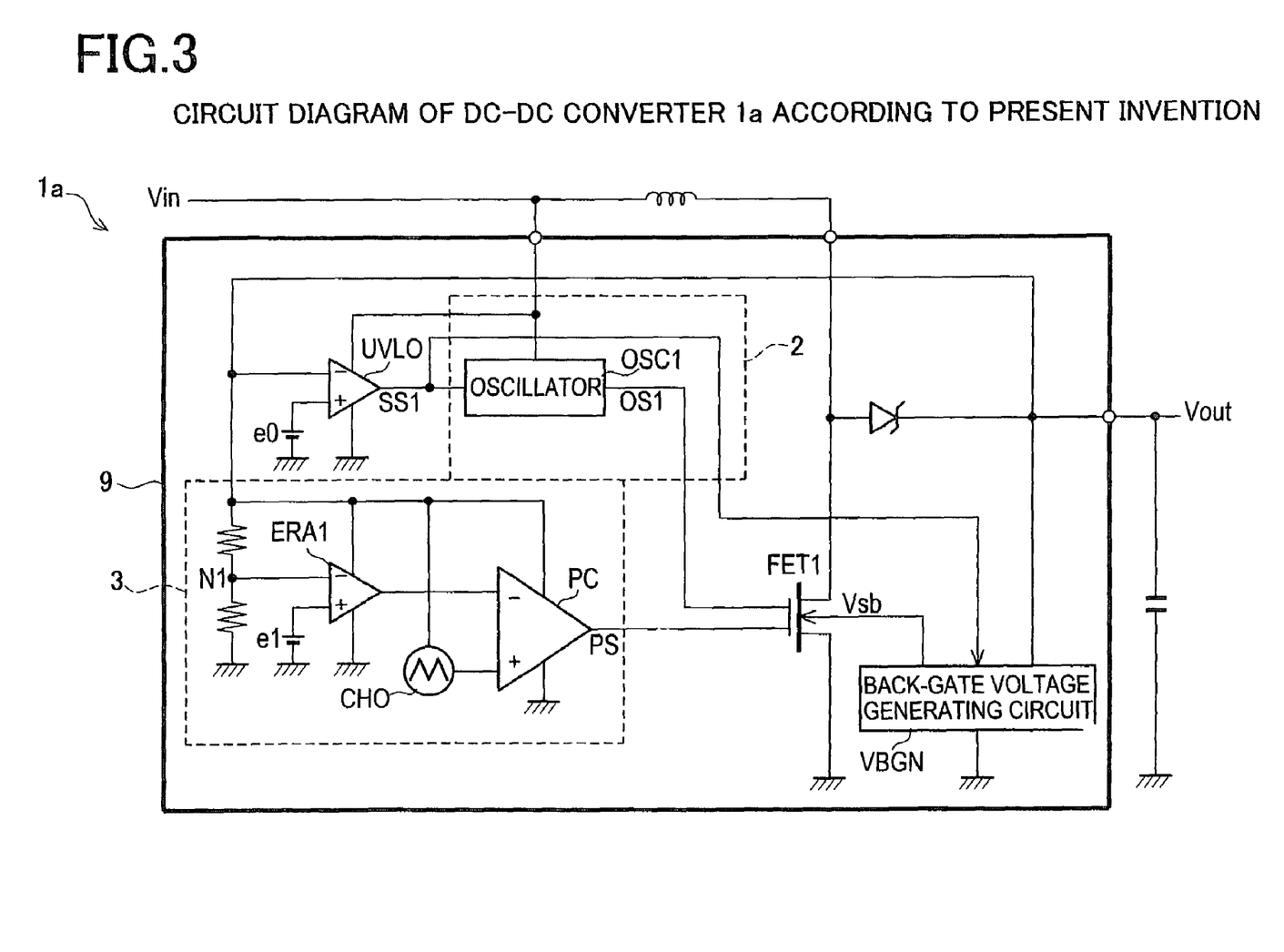
FIG. 3 is a circuit diagram of a DC-DC converter 1 according to the present invention.

When the DC-DC converter 1 is started up, the oscillator OSC1 reaches an operational state in response to a high-level control signal SS1, so that an oscillation signal OS1 is outputted. Further, an inverted signal of the control signal SS1 brings the error amplifier ERA1, the triangular-wave oscillator CHO, and the PWM comparator PC into a stopped state, so that a pulse signal PS is not outputted. Therefore, according to the oscillation signal OS1, the transistor FET1 performs electrically conductive/non-conductive operations, and the output voltage Vout of the DC-DC converter 1 is gradually raised.

On the other hand, when the DC-DC converter 1 is in a steady state, the oscillator OSC1 reaches a stopped state in response to a low-level control signal SS1, so that an oscillation signal OS1 is not outputted. Further, an inverted signal of the control signal SS1 brings the error amplifier ERA1, the triangular-wave oscillator CHO, and the PWM comparator PC into an operational state, so that a pulse signal PS is outputted. Therefore, the on-duty of the transistor FET1 is controlled according to the pulse signal PS. Therefore, in the DC-DC converter 1a, the switch SW1 can be omitted, and the circuit size of the DC-DC converter can be reduced.

Additionally, the oscillator OSC1 actuated at the start-up is small in the driving ability. However, since gate capacitance that is small in capacitance is driven because of a structure in which a part of the multi-gate is connected to the oscillator OSC1, the load of the oscillator OSC1 can be reduced at the start-up, and the oscillator OSC1 can be operated even by a low voltage. In this case, the on-resistance of the transistor FET1 at the start-up becomes large. However, no problem arises, because the start-up state lasts only a short time, so that an influence exerted on power consumption is negligible. Additionally, since most of the multi-gate is connected to the PWM comparator PC working during the steady operation, the on-resistance of the transistor FET1 working during the steady operation can be satisfactorily reduced, and the DC-DC converter can be prevented from lowering its efficiency.

It is to be noted that the start-up period is an example of the first period, the steady state period is an example of the second period, the reference voltage e0 is an example of the reference voltage, the charge pump portion 5 is an example of the second back-gate voltage generating portion, the start-up control circuit 2 is an example of the first control unit, the PWM control circuit 3 is an example of the second control unit, the switch SW13 is an example of the first switch portion, and the switch SW1 is an example of the second switch portion.

According to the DC-DC converter and the method for controlling the DC-DC converter of the present invention, the DC-DC converter can be started up even when an input voltage is low. Additionally, high efficiency can be achieved by preventing a leakage current, and an increase in the circuit size can be prevented.

What is claimed is:

1. A step-up type DC-DC converter comprising:
    a main switching transistor that is an N-type conductive element;
    a comparator that makes a comparison between a reference voltage and an output voltage and makes a discrimination between a first period during which the output voltage is lower than the reference voltage and a second period during which the output voltage is higher than the reference voltage; and
    a back-gate control unit that, in accordance with a comparison result obtained from the comparator, sets a back-gate voltage of the main switching transistor at a first back-gate voltage during the first period, and sets the back-gate voltage thereof at a second back-gate voltage lower than the first back-gate voltage during the second period.

2. The step-up type DC-DC converter according to claim 1, wherein the reference voltage is a minimum voltage necessary to obtain drive ability of the main switching transistor that satisfies specifications of the DC-DC converter, and is determined in accordance with a back-gate bias effect of the main switching transistor that is fixed by the second back-gate voltage.

3. The step-up type DC-DC converter according to claim 1, wherein the back-gate control unit comprises:
    a first back-gate voltage generating portion that, in accordance with a comparison result obtained from the comparator, supplies a grounded voltage so as to be used as the first back-gate voltage during the first period, and is stopped so as not to be operated during the second period; and
    a second back-gate voltage generating portion that, in accordance with a comparison result obtained from the comparator, is stopped so as not to be operated during the first period, and generates a second back-gate voltage during the second period.

4. The step-up type DC-DC converter according to claim 3, wherein the first back-gate voltage generating portion includes a first switch portion one side of which is grounded, the first switch portion being in an electrically conductive state during the first period and being in an electrically non-conductive state during the second period.

5. The step-up type DC-DC converter according to claim 1, further comprising:
    a first control unit that is operated by a voltage lower than the reference voltage and that performs switching control of the main switching transistor;
    a second control unit that is operated by a voltage higher than the reference voltage and that performs switching control of the main switching transistor; and
    a second switch portion that, in accordance with a comparison result obtained from the comparator, selects the first control unit during the first period, and selects the second control unit during the second period.

6. The step-up type DC-DC converter according to claim 1, wherein the main switching transistor includes a first gate and a second gate between which a pair of source/drain are shared; the first control unit, which is operated by a voltage lower than the reference voltage and which performs switching control of the main switching transistor, drives the first gate; and the second control unit, which is operated by a voltage higher than the reference voltage and which performs switching control of the main switching transistor, drives the second gate.

7. The step-up type DC-DC converter according to claim 6, wherein a size of the first gate is made smaller than that of the second gate.

8. The step-up type DC-DC converter according to claim 6, wherein the main switching transistor has a multi-gate structure in which a plurality of gates are laid out with respect to a pair of source/drain, and a part of the plurality of gates is assigned as the first gate, whereas the remainder of the plurality of gates is assigned as the second gate.

9. The step-up type DC-DC converter according to claim 4, wherein the reference voltage is a minimum voltage by which the second control unit can be driven.

10. The step-up type DC-DC converter according to claim 5, wherein the reference voltage is a minimum voltage by which the second control unit can be driven.

11. A method for controlling a step-up type DC-DC converter, comprising:
- a step of making a comparison between a reference voltage and an output voltage and making a discrimination between a first period during which the output voltage is lower than the reference voltage and a second period during which the output voltage is higher than the reference voltage; and
- a step of setting a back-gate voltage of a main switching transistor at a first back-gate voltage during the first period and setting the back-gate voltage thereof at a second back-gate voltage lower than the first back-gate voltage during the second period.

* * * * *